US012782441B2

(12) United States Patent
Miyamoto et al.

(10) Patent No.: US 12,782,441 B2
(45) Date of Patent: Nov. 3, 2026

(54) ELECTRICAL DISCHARGE DETECTION SYSTEM

(71) Applicant: NITTO KOGYO CORPORATION, Nagakute (JP)

(72) Inventors: Atsushi Miyamoto, Nagakute (JP); Tomoyasu Sakai, Nagakute (JP); Hiyori Ajioka, Nagakute (JP)

(73) Assignee: NITTO KOGYO CORPORATION, Nagakute (JP)

( * ) Notice: Subject to any disclaimer, the term of this patent is extended or adjusted under 35 U.S.C. 154(b) by 350 days.

(21) Appl. No.: 18/689,574

(22) PCT Filed: Sep. 9, 2022

(86) PCT No.: PCT/JP2022/033905

§ 371 (c)(1),
(2) Date: Oct. 9, 2024

(87) PCT Pub. No.: WO2023/038121

PCT Pub. Date: Mar. 16, 2023

(65) Prior Publication Data

US 2025/0044354 A1 Feb. 6, 2025

(30) Foreign Application Priority Data

Sep. 10, 2021 (JP) ................................ 2021-147745

(51) Int. Cl.
*G01R 31/327* (2006.01)
*H02H 3/16* (2006.01)

(52) U.S. Cl.
CPC ............ *G01R 31/327* (2013.01); *H02H 3/16* (2013.01)

(58) Field of Classification Search
None
See application file for complete search history.

(56) References Cited

U.S. PATENT DOCUMENTS 8,335,062 B2 * 12/2012 Haines .................. H02H 5/105 320/109
12,160,168 B2 * 12/2024 Dent ..................... H02H 7/122
(Continued)

FOREIGN PATENT DOCUMENTS

JP S5648022 A 5/1981
JP 200145652 A 2/2001
(Continued)

*Primary Examiner* — Richard Isla
(74) *Attorney, Agent, or Firm* — The Webb Law Firm

(57) ABSTRACT

A discharge detection system includes a main breaker; a number of branch breakers; a number of discharge detection units; and at least one current limiting resistor. Each branch breaker is configured to interrupt a circuit based on a difference in a current value between a current $I_1$ flowing in a first electrode and a current $I_2$ flowing in a second electrode. Each discharge detection unit includes a discharge detection section configured to detect a noise superimposed on a voltage or current and a switch electrically connected to the first electrode of the corresponding branch breaker. The switch of each discharge detection unit has a secondary side electrically connected to common wirings. The wiring is electrically connected to an electrode different from the electrode electrically connected to the first electrode of the branch breaker out of the electrodes of the main breaker, and the current limiting resistor passes a current $I_E$ as part of the current $I_1$ through the wirings when the switch is in a closed state.

6 Claims, 10 Drawing Sheets

(56) References Cited

U.S. PATENT DOCUMENTS

| | | | | |
|---|---|---|---|---|
| 2002/0008950 | A1 | 1/2002 | Kim et al. | |
| 2005/0212526 | A1 | 9/2005 | Blades | |
| 2017/0317500 | A1* | 11/2017 | Kumar | H02H 3/16 |
| 2021/0035750 | A1 | 2/2021 | Miyamoto et al. | |
| 2026/0153552 | A1* | 6/2026 | Ito | G01R 31/088 |

FOREIGN PATENT DOCUMENTS

| | | | |
|---|---|---|---|
| JP | 2013062955 | A | 4/2013 |
| JP | 5577190 | B2 | 8/2014 |
| JP | 2016208611 | A | 12/2016 |
| JP | 2016220265 | A | 12/2016 |
| JP | 2017175734 | A | 9/2017 |
| JP | 2020112420 | A | 7/2020 |
| JP | 2020122669 | A | 8/2020 |
| JP | 2021081397 | A | 5/2021 |
| WO | 2019198791 | A1 | 10/2019 |

* cited by examiner 40
30
20

40

40
32

40
22
CURRENT
SIGNAL

ELECTRICAL DISCHARGE DETECTION SYSTEM

CROSS-REFERENCE TO RELATED APPLICATIONS

This application is the United States national phase of International Patent Application No. PCT/JP2022/033905 filed Sep. 9, 2022, and claims priority to Japanese Patent Application No. 2021-147745 filed Sep. 10, 2021, the disclosures of which are hereby incorporated by reference in their entireties.

BACKGROUND OF THE INVENTION

Field of the Invention

The present invention relates to a discharge detection system.

Description of Related Art

Japanese Patent Application Kokai Publication No. 2020-122669 (Patent Document 1) discloses a discharge detection structure to detect discharge occurred in electrical circuits. This discharge detection structure is built in, for example, a distribution board to be electrically connected to an electrical circuit, such as indoor wirings. The electrical circuit is electrically connected to a load, not shown. The load refers to a device that operates by consuming power, such as a lighting fixture, a display, an air conditioner, and a refrigerator, for example. The discharge detection structure is provided with a plurality of noise detection sections and at least one arithmetic section. The plurality of noise detection sections are electrically connected to the secondary side of the respective branch breakers configuring the distribution board. If an accident, such as tracking, a short circuit, disconnection, and a leakage current, occurs in the electrical circuit or the load, discharge takes place between electric wires or between electrodes. If discharge occurs, a noise is superimposed on the voltage or current in the electrical circuit. The noise detection sections detect noises in a high frequency band superimposed on the voltage or current by a high pass filter. The arithmetic section determines whether discharge has occurred based on the noise detected by any of the noise detection sections. If determining that discharge has occurred, the arithmetic section sends a signal to at least one of the branch breakers to interrupt the specific branch breaker related to the occurrence of discharge.

Meanwhile, Japanese Patent Application Kokai Publication No. S56-48022 (Patent Document 2) discloses a circuit breaker provided with a test circuit. The test circuit is provided with a test switch. The test circuit generates an artificial leakage current by operating the test switch. The circuit breaker operates based on the artificial leakage current and interrupts the electrical circuit.

PRIOR ART DOCUMENTS

Patent Document

Patent Document 1: Japanese Patent Application Kokai Publication No. 2020-122669

Patent Document 2: Japanese Patent Application Kokai Publication No. S56-48022

Patent Document 3: Japanese Patent Application Kokai Publication No. 2016-208611

SUMMARY OF THE INVENTION

Problems to be Solved by the Invention

The artificial leakage current disclosed in Japanese Patent Application Kokai Publication No. S56-48022 is to test the behavior of a circuit breaker. Meanwhile, in the discharge detection structure disclosed in Japanese Patent Application Kokai Publication No. 2020-122669, it is considered to apply an artificial leakage current in order to interrupt at least one of the plurality of branch breakers. This is because the artificial leakage current can be generated only by closing the switch and is thus a simple and effective approach to individually interrupt the plurality of branch breakers.

However, to pass the current of an artificial leakage current through such a branch breaker, a bypass circuit has to be electrically connected to the primary side of the branch breaker. The bypass circuit is equivalent to, for example, the wirings electrically connecting the test switch 27 to the output terminal devices 18 in FIG. 5 of Japanese Patent Application Kokai Publication No. S56-48022. To individually interrupt a plurality of branch breakers, bypass circuits have to be electrically connected to the respective branch breakers. Addition of the bypass circuits of the same number as the branch breakers to the distribution board causes the entire circuit in the distribution board to be extremely complex. Addition of the plurality of bypass circuits also takes enormous effort. Japanese Patent Application Kokai Publication No. 2016-208611 (Patent Document 3) discloses a distribution board having a main breaker, a plurality of busbars, and a plurality of branch breakers, each of the main breaker, the busbars, and the branch breakers being unitized. There are no void spaces at all between the unitized main breaker, busbars, and branch breakers, and thus it is almost not possible to add a plurality of bypass circuits.

The present invention has been made in view of the above problems, and it is an object thereof to provide a discharge detection system that is capable of individually interrupting a plurality of branch breakers by generating an artificial leakage current and can be configured with an extremely simple circuit.

Means to Solve the Problems (1) To achieve the above object, a discharge detection system of the present invention includes: a main breaker; a plurality of branch breakers; a plurality of discharge detection units; and at least one current limiting resistor, wherein the main breaker has a plurality of electrodes for outputting power; each of the branch breakers has first and second electrodes electrically connected to at least two of the plurality of electrodes of the main breaker and is configured to interrupt a circuit based on a difference in a current value between a current $I_1$ flowing in the first electrode and a current $I_2$ flowing in the second electrode, each of the discharge detection units is provided with a discharge detection section and a switch, the discharge detection section being electrically connected between the first electrode and the second electrode of the corresponding branch breaker and being configured to detect a noise at a predetermined frequency or more superimposed on a voltage or current of the circuit, and the switch being electrically connected to the first electrode of the corresponding branch breaker, the switch of each discharge detection unit has a secondary side electrically connected to a common first electric line, the first electric line is electrically connected to an electrode different from the electrode electrically connected to the first electrode of the branch breaker out of the electrodes of the main breaker, and the current limiting resistor passes a current $I_E$ as part of the current $I_1$ through the first electric line when the switch is in a closed state.

(2) It is preferred that the discharge detection system of (1) above further includes a control unit capable of sending and receiving a signal to and from each discharge detection unit, wherein each discharge detection unit is electrically connected to the control unit via a common second electric line, the discharge detection unit sends a first signal if the noise is detected by the discharge detection section, the control unit determines whether discharge has occurred in the circuit based on the first signal, and if determining that discharge has occurred, sends a second signal, and the discharge detection unit having sent the first signal causes the switch to be in a closed state based on the second signal.

(3) It is preferred that the discharge detection system of (1) or (2) above includes a plurality of the current limiting resistors corresponding to the respective discharge detection units, wherein each of the current limiting resistors is built in the corresponding discharge detection unit and is electrically connected to the secondary side of the switch, and the first electric line is electrically connected to the secondary side of the current limiting resistor.

(4) It is preferred that the discharge detection system of (2) above includes the one current limiting resistor corresponding to the respective discharge detection units, wherein the current limiting resistor is built in the control unit, and the control unit is electrically connected to middle of the first electric line.

(5) It is preferred that, in the discharge detection system of (2) or (4) above, the control unit varies a timing of sending the second signal to each of the two or more discharge detection units if determining that discharge has occurred in two or more of the circuits based on the first signals received from the respective discharge detection units.

(6) It is preferred that, in the discharge detection system of (5) above, the control unit sends the second signal to any one of the two or more discharge detection units and then sends a third signal to the same discharge detection unit, and based on no response to the third signal, sends the second signal to another of the discharge detection units.

Effects of the Invention

The discharge system of the present invention is capable of individually interrupting a plurality of branch breakers by generating an artificial leakage current and can be configured with an extremely simple circuit. Accordingly, the discharge detection system of the present invention does not require the effort of adding the bypass circuit illustrated in FIG. 5 of Japanese Patent Application Kokai Publication No. S56-48022 to each of the plurality of discharge detection units.

DESCRIPTION OF THE INVENTION

The discharge detection systems according to the first through fifth embodiments of the present invention are described below with reference to the drawings.

1. First Embodiment

Figure 1:
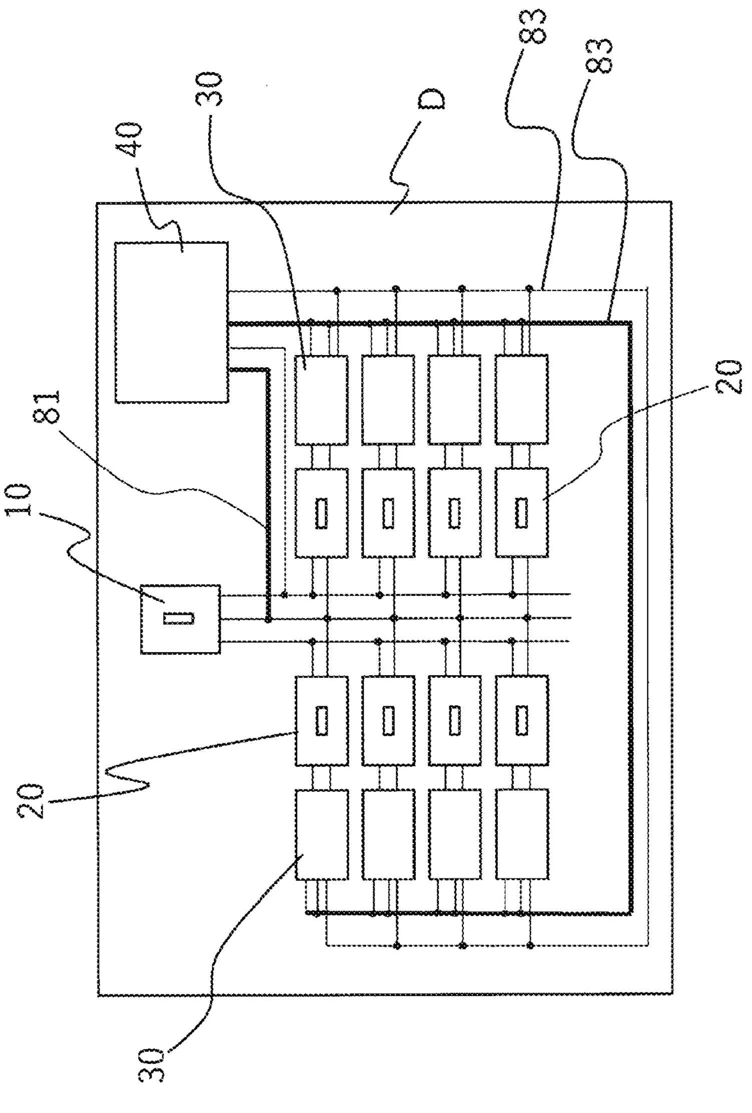
FIG. 1 is a schematic diagram illustrating a distribution board provided with a discharge detection system according to a first embodiment.

At first, with reference to FIGS. 1 through 5 and FIGS. 8A through 8D, a description is given to the discharge detection system according to the first embodiment of the present invention. As illustrated in FIG. 1, the discharge detection system in the present embodiment is built in a distribution board D. The distribution board D includes a main breaker 10, eight branch breakers 20, eight discharge detection units 30, a control unit 40, and to electrically connect them, wirings 81, wirings 83, buses, and other electric lines.

It should be noted that the numbers of the branch breakers 20 and the discharge detection units 30 are not particularly limited. The numbers of the branch breakers 20 and the discharge detection units 30 may be seven or less or may be nine or more. The form of the wirings 81, the wirings 83, the buses, and the other electric lines is not particularly limited. For example, electric wires and/or busbars may be used as the wirings 81, the wirings 83, the buses, and the other electric lines.

The main breaker 10 and the branch breakers 20 are general components of the distribution board D. To the main breaker 10, utility power is supplied from outdoor wirings, not shown. The utility power is supplied to indoor wirings via each of the branch breakers 20. A plurality of loads, not shown, are electrically connected to the indoor wirings.

The main breaker 10 in the present embodiment is of a 3P2E (3-Pole 2-Element) system and is provided with three electrodes. The three electrodes correspond to an L1 phase, an L2 phase, and an N phase illustrated in FIG. 2. Both the L1 phase and the L2 phase are voltage phases. The N phase is a neutral phase. The three electrodes are electrically connected to the respective buses. In this situation, the four branch breakers 20 on the right in FIG. 1 are electrically connected to the bus of the L1 phase and the bus of the N phase. Meanwhile, the four branch breakers 20 on the left in FIG. 1 are electrically connected to the bus of the L2 phase and the bus of the N phase.

It should be noted that the main breaker 10 may be a circuit breaker that detects an overcurrent and a short circuit and interrupts the circuit. The main breaker 10 is preferably a leakage breaker that detects a leakage current and interrupts the circuit.

Figure 2:
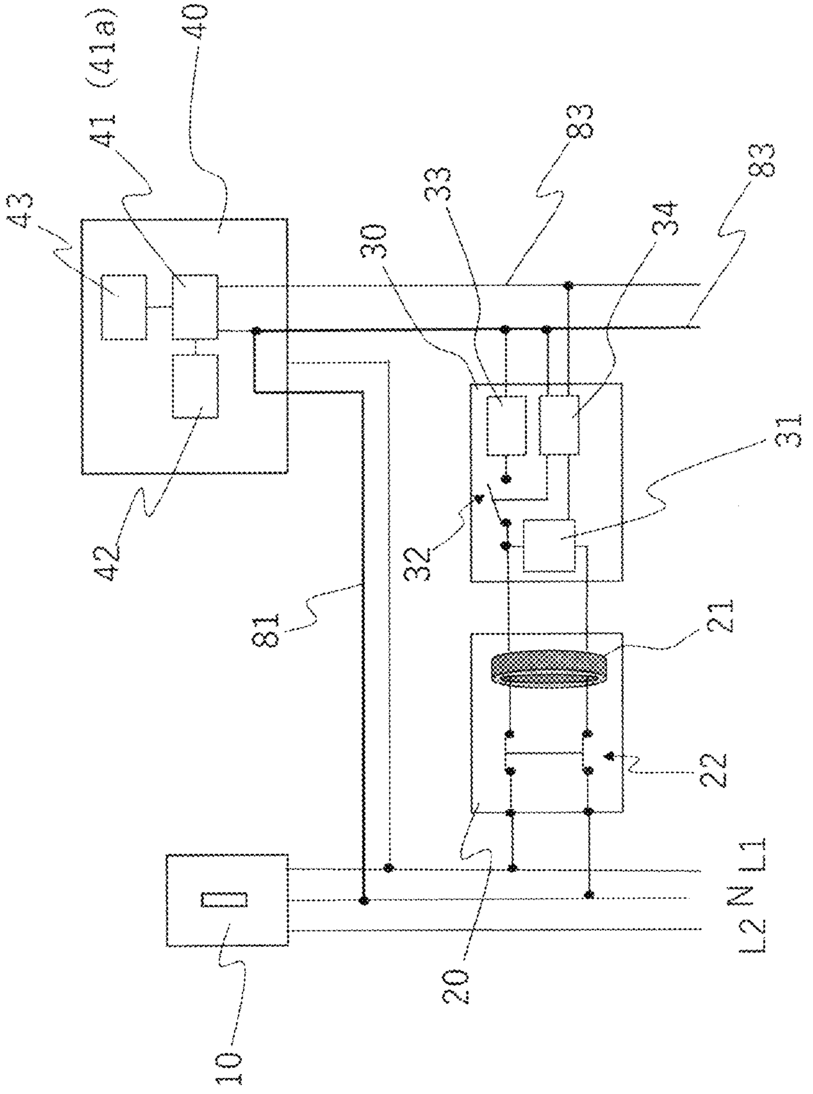
FIG. 2 is a schematic diagram illustrating a main breaker, one of branch breakers, one of discharge detection units, a control unit, and electric lines configuring the discharge detection system.

Each branch breaker 20 in the present embodiment is leakage breakers and has a function of detecting a leakage current and interrupting the circuit. As illustrated in FIG. 2, the branch breaker 20 is provided with a ZCT (Zero-phase Current Transformer) 21 and two switches 22. The first switch 22 is electrically connected between the bus of the L1 phase and the discharge detection unit 30. The second switch 22 is electrically connected between the bus of the N phase and the discharge detection unit 30. The two electric wires electrically connected to these switches 22 pass through the ZCT 21. The ZCT 21 detect a leakage current based on the difference in the current value between the currents $I_1$ and $I_2$ flowing in the two electric wires. If the ZCT 21 detects a leakage current, the two switches 22 turn into an open state and the power supply to the secondary side of the branch breaker 20 is stopped.

The respective secondary sides of the eight branch breakers 20 illustrated in FIG. 1 are electrically connected to the discharge detection units 30. The secondary sides of the eight discharge detection units 30 are electrically connected to the two common wirings 83. As illustrated in FIG. 2, each discharge detection unit 30 is provided with a discharge detection section 31, a switch 32, a current limiting resistor 33, and an internal communication section 34.

The discharge detection section 31 is, for example, an RC circuit and is configured with a capacitor and a resistor that are connected in series. The discharge detection section 31 is electrically connected between the cathode (first electrode) and the anode (second electrode) of the branch breaker 20. In this situation, if discharge occurs in an indoor wiring or a load, a noise in a high frequency band is superimposed on the voltage or current. The discharge detection section 31 passes noise components at a predetermined frequency or more to detect the discharge.

The internal communication section 34 is electrically connected to the control unit 40 via the two wirings 83. One of the wirings 83 is a voltage phase, and the other wiring 83 is a ground phase. The internal communication section 34 and the control unit 40 send and receive signals to and from each other through the wiring 83 of the ground phase. If the discharge is detected by the discharge detection section 31, the internal communication section 34 outputs a signal to the control unit 40. This signal includes, in addition to information on the noise, an address to identify the eight discharge detection units 30. The control unit 40 obtains information, such as the noise level, the time of day when the noise is detected, and the duration time of the noise, based on a first signal sent from the internal communication section 34. If determining that discharge has occurred, the control unit 40 outputs a second signal to the internal communication section 34. The internal communication section 34 changes the switch 32 from the open state to the closed state based on the second signal from the control unit 40 (refer to FIG. 3). The switch 32 is thus electrically connected to the current limiting resistor 33. The secondary side of the current limiting resistor 33 is electrically connected to the wiring 83 of the voltage phase.

Figure 3:
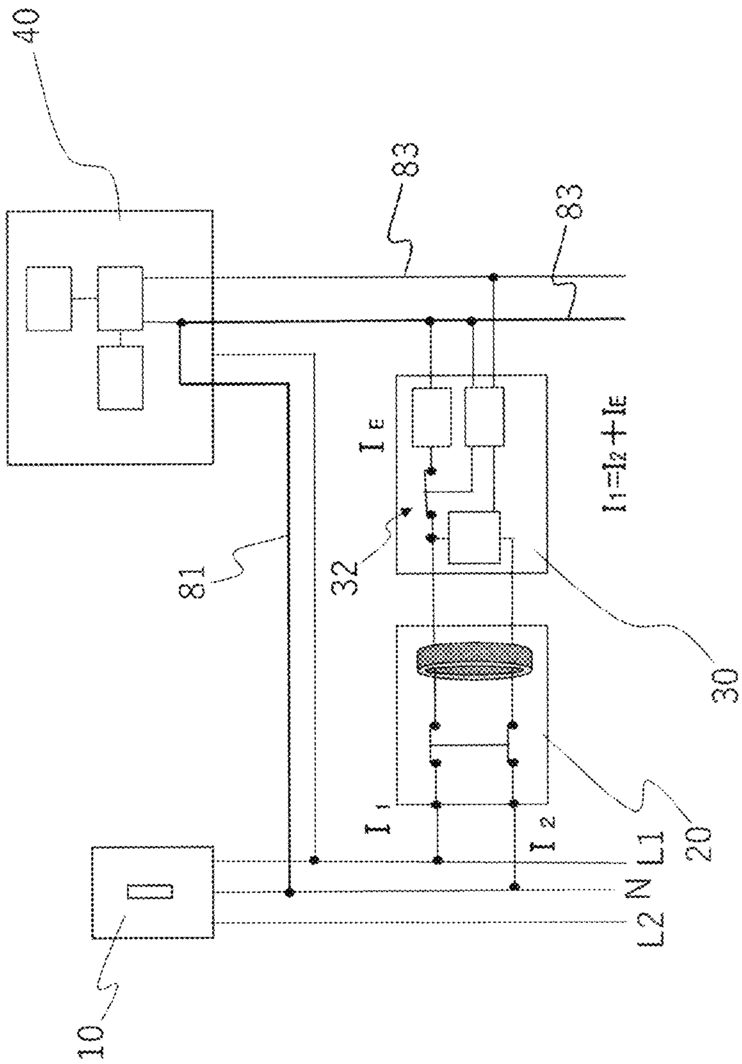
FIG. 3 is a schematic diagram illustrating a switch, in a closed state, that configures the discharge detection unit.

The switch 32 and the current limiting resistor 33 configure a circuit to generate an artificial leakage current. As illustrated in FIG. 3, the switch 32 in the closed state causes the current $I_E$ as part of the current $I_1$ flowing from the bus of the L1 phase to the branch breaker 20 to flow into the wiring 83 of the voltage phase via the current limiting resistor 33. This current $I_E$ is the artificial leakage current and has the current value in accordance with the resistance value of the current limiting resistor 33. The current $I_E$ flows into the bus of the N phase electrically connected to the wiring 83. If the switch 32 turns into a closed state, the relationship between the currents $I_1$, $I_2$, and $I_E$ flowing in and out of the branch breaker 20 is $I_1=I_2+I_E$. In the case of $I_1 \neq I_2$, the ZCT 21 of the branch breaker 20 changes the two switches 22 from the closed state to the open state. The branch breaker 20 electrically connected to the primary side of the discharge detection unit 30 is thus interrupted. As a result, the power supply to the secondary side of the branch breaker 20 is stopped.

In this situation, the branch breaker 20 as a leakage breaker has a value of the sensitivity current set to detect leakage currents. If the current value of a leakage current is more than the sensitivity current value, the ZCT 21 changes the two switches 22 from the closed state to the open state. Accordingly, the current value of the current $I_E$ is set to be more than the sensitivity current value by selecting the resistance value of the current limiting resistor 33.

In the discharge detection system of the present embodiment, each of the eight discharge detection units 30 illustrated in FIG. 1 is configured to include the current limiting resistor 33. Even if the different sensitivity current values are set in the eight branch breakers 20, it is possible to apply the current limiting resistors 33 having an optimum resistance value for the respective branch breakers 20.

As illustrated in FIG. 2, the control unit 40 is electrically connected to the buses of the L1 phase and the N phase via the two wirings 81. The control unit 40 receives power supply from the bus of the L1 phase. The control unit 40 is provided with an arithmetic section 41, an external communication section 42, and a display section 43.

The arithmetic section 41 is electrically connected to the two wirings 83. The arithmetic section 41 sends and receives signals to and from each of the eight discharge detection units 30 through the wiring 83 of the ground phase. Meanwhile, the wiring 83 of the voltage phase is electrically connected to the wiring 81 of the ground phase in the control unit 40. The current $I_E$ having passed through the current limiting resistor 33 of the discharge detection unit 30 thus flows from the wiring 83 of the voltage phase through the wiring 81 of the ground phase to the bus of the N phase (refer to FIG. 5).

In this situation, the common electric line in which the current $I_E$ flows is configured with the two wirings 83 and 81 in the present embodiment while it is not limited to this configuration. The common electric line in which the current $I_E$ flows may be configured with one wiring or three or more wirings. Such a wiring in this case may be any of an electric wire and/or a busbar.

The arithmetic section 41 obtains the information described above, such as the level of the noise level, the time of day when the noise is detected, and the duration time of the noise, based on the signal sent from the internal communication section 34. The arithmetic section 41 also determines whether discharge has occurred based on the level of the noise level. For example, the arithmetic section 41 determines that discharge has occurred if a noise at a level more than a threshold is detected. Moreover, if a noise at a level more than the threshold is detected in the plurality of discharge detection units 30, the arithmetic section 41 executes a process of specifying any one of the discharge detection units 30. For example, the arithmetic section 41 specifies the discharge detection unit 30 that detected the noise at the earliest time of day out of the plurality of discharge detection units 30 based on the time of day of the noise detection. The noise detection at the earliest time of day means that the noise is transmitted earliest and it is considered to be highly related to the source of the discharge. It should be noted that the arithmetic section 41 has a function of an internal communication section 41*a* to send and receive signals to and from the internal communication section 34.

The external communication section 42 is provided to send information to an external device, not shown. For example, the information on discharge obtained by the process of the arithmetic section 41 is sent from the external communication section 42 to the external device. The display section 43 is a display and/or an LED lamp to visually display the information. For example, the display section 43 visually reports that discharge has occurred by text, images, light, and the like.

The behavior of the discharge detection system in the present embodiment is then described with reference to FIGS. 4, 5, and 8A through 8D.

Figure 4:
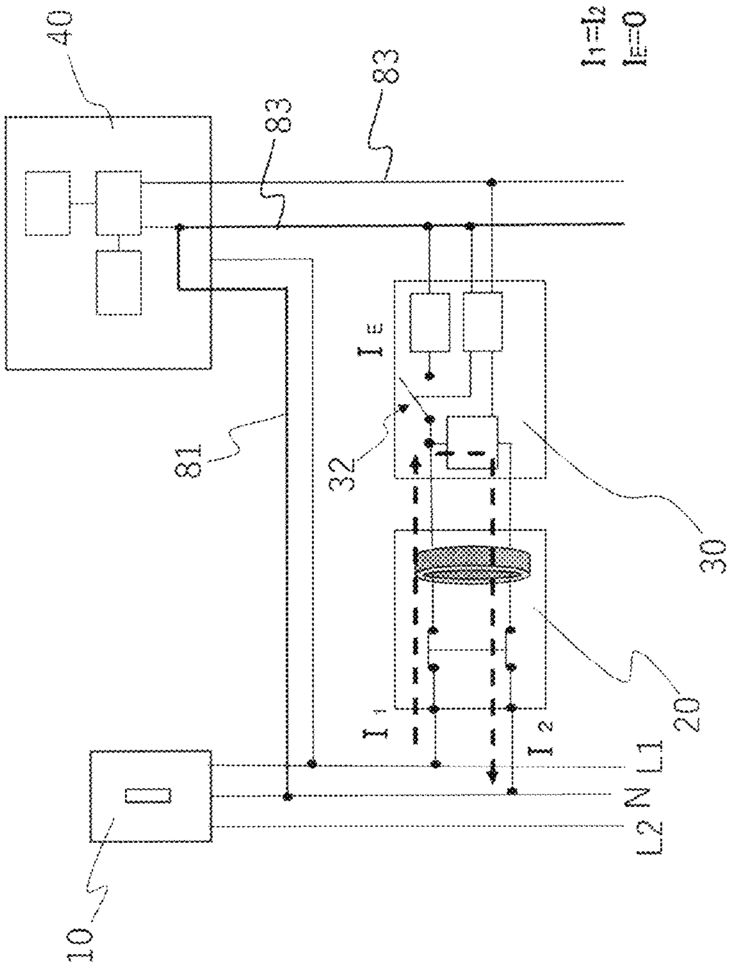
FIG. 4 is a schematic diagram illustrating a current flow when the switch configuring the discharge detection unit is in an open state.

FIG. 4 illustrates the main breaker 10, one of the branch breakers 20, one of the discharge detection units 30, the control unit 40, and electric lines configuring the discharge detection system. In the discharge detection unit 30 of FIG. 4, the discharge detection section 31 has not detect discharge yet. Accordingly, the switch 32 is in the open state. The broken lines in FIG. 4 illustrate the current path when the switch 32 is in the open state. The current flows from the bus of the L1 phase to the cathode of the branch breaker 20, passes through the discharge detection section 31 of the discharge detection unit 30, and flows from the anode of the branch breaker 20 into the bus of the N phase. If the switch 32 is in the open state, the relationship between the currents $I_1$ and $I_2$ flowing in and out of the branch breaker 20 becomes $I_1=I_2$. In the case of $I_1=I_2$, the ZCT 21 of the branch breaker 20 does not operate and the two switches 22 are maintained in the closed state. As a result, the power supply to the secondary side of the branch breaker 20 is also maintained.

Figures 8A, 8B, 8C, 8D:
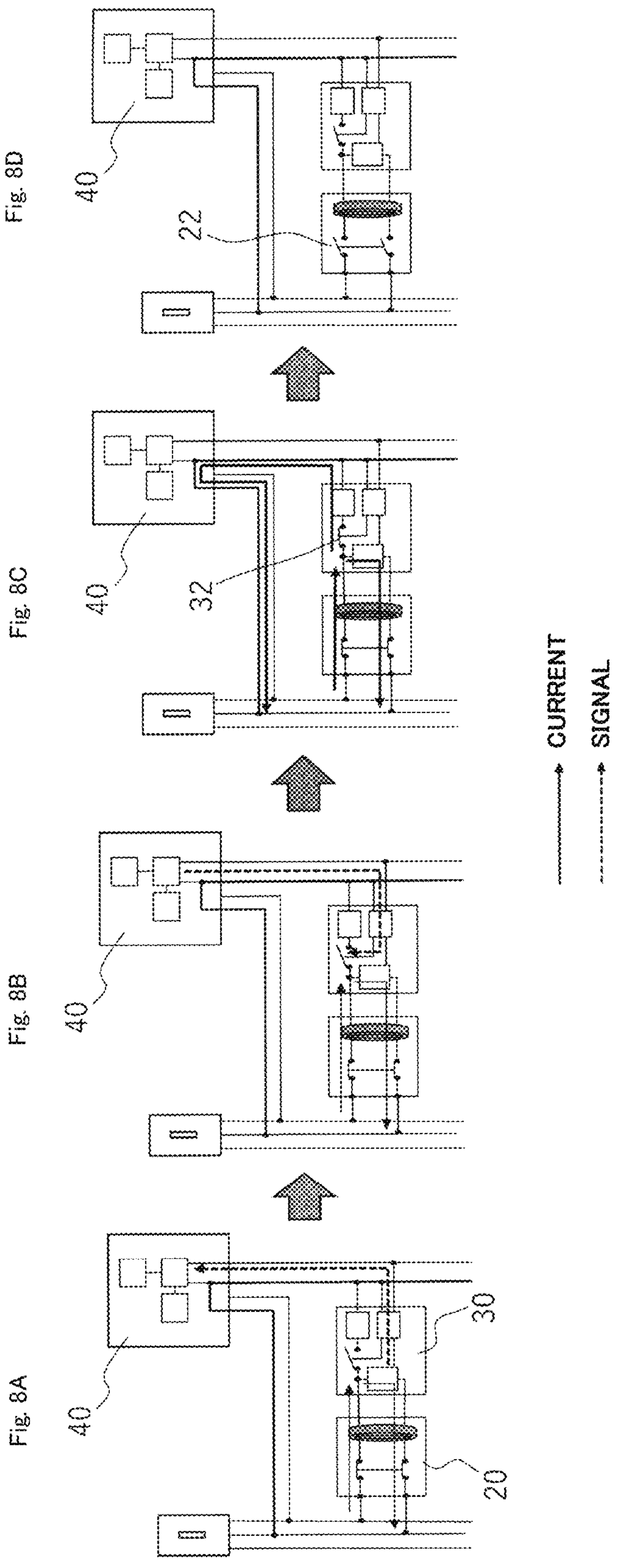
FIGS. 8A through 8D are schematic diagrams illustrating behavior of the discharge detection system in the first embodiment from detecting discharge until interrupting the branch breaker.

In the discharge detection unit 30 of FIG. 4, if the discharge detection section 31 detects discharge, the internal communication section 34 sends a first signal (refer to the arrow of the broken line in FIG. 8A). This first signal is received by the arithmetic section 41 (internal communication section 41*a*) of the control unit 40 through the wiring 83 of the ground phase. The arithmetic section 41 identifies the discharge detection unit 30 having sent the first signal based on the received first signal and determines whether discharge has occurred. If determining that discharge has occurred, the arithmetic section 41 sends a second signal to the identified specific discharge detection unit 30 (refer to the arrow of the broken line in FIG. 8B). This second signal is received by the internal communication section 34 of the discharge detection unit 30 in FIG. 4 through the wiring 83 of the ground phase. The internal communication section 34 changes the switch 32 from the open state to the closed state based on the received second signal.

Figure 5:
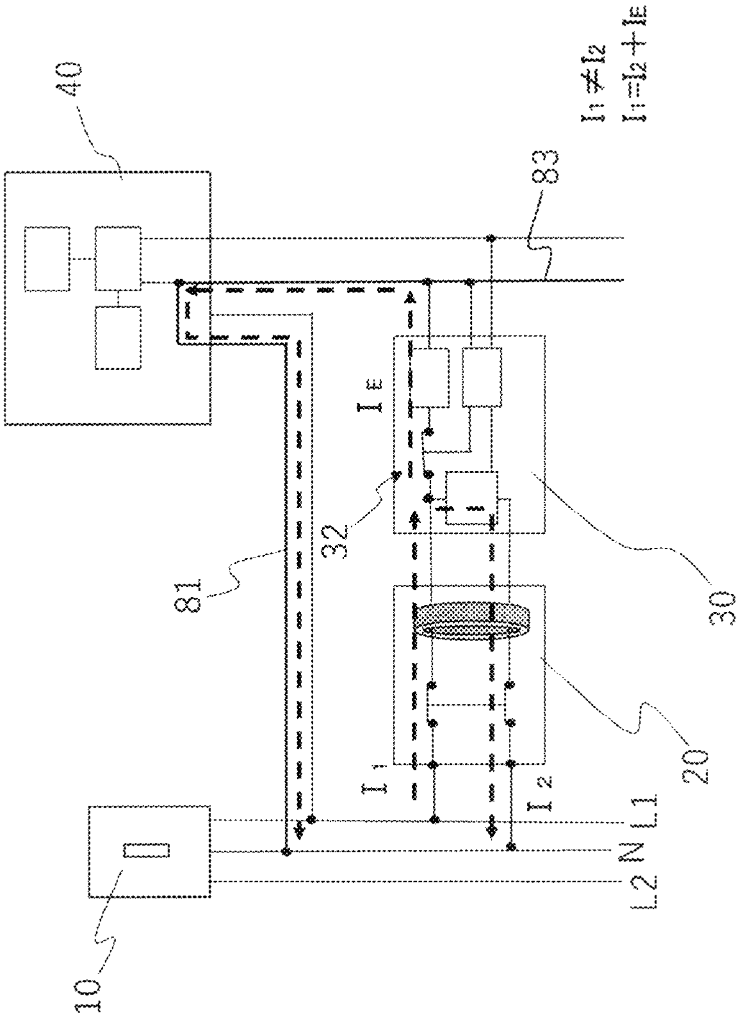
FIG. 5 is a schematic diagram illustrating a current flow when the switch configuring the discharge detection unit is in a closed state.

FIG. 5 illustrates the discharge detection system when the switch 32 of the discharge detection unit 30 is in the closed state. The broken lines in FIG. 5 illustrates the current path when the switch 32 of the discharge detection unit 30 is in the closed state. The switch 32 in the closed state causes the current $I_E$ as part of the current $I_1$ flowing from the bus of the L1 phase to the cathode of the branch breaker 20 to flow into the wiring 83 of the voltage phase via the current limiting resistor 33. The current $I_E$ flows from the wiring 83 of the voltage phase through the wiring 81 of the ground phase into the bus of the N phase. Meanwhile, the current $I_2$ obtained by subtracting the current $I_E$ from the current $I_1$ passes through the discharge detection section 31 of the discharge detection unit 30 and flows from the anode of the branch breaker 20 into the bus of the N phase (for this situation, refer to the arrows in FIG. 8C).

As illustrated in FIG. 5, if the switch 32 turns into the closed state, the relationship between the currents $I_1$, $I_2$, and $I_E$ flowing in and out of the branch breaker 20 becomes $I_1=I_2+I_E$. In the case of $I_1+I_2$, the ZCT 21 of the branch breaker 20 changes the two switches 22 from the closed state to the open state (refer to the switches 22 in FIG. 8D). The branch breaker 20 electrically connected to the primary side of the discharge detection unit 30 is thus interrupted. As a result, the power supply to the secondary side of this branch breaker 20 is stopped.

The discharge detection system described above in the present embodiment allows individual interruption of the eight branch breakers 20 by generating an artificial leakage current. In addition, the discharge detection system in the present embodiment can be configured with the extremely simple circuit of the three wirings 81, 83, and 83 illustrated in FIG. 1. That is, the eight discharge detection units 30 share the wiring 83 of the ground phase and send and receive signals to and from the control unit 40. The eight discharge detection units 30 also share the wiring 83 of the voltage phase and the wiring 81 of the ground phase to use these wirings 83 and 81 as the path for the artificial leakage current (current $I_E$). Accordingly, the discharge detection system in the present embodiment does not require the effort of adding the bypass circuit illustrated in FIG. 5 of Japanese Patent Application Kokai Publication No. S56-48022 to each of the eight discharge detection units 30.

2. Second Embodiment

The discharge detection system described above in the first embodiment is configured to electrically connect the wiring 81 of the ground phase of the control unit 40 to the bus of the N phase (refer to FIG. 5). The reason for such a configuration is because the cathodes of the eight branch breakers 20 illustrated in FIG. 1 are connected to the buses of the L1 phase and the L2 phase. The wiring 81 of the ground phase of the control unit 40 is the path for the artificial leakage current (current $I_E$). The artificial leakage current flowing in the wiring 81 returns to the cathode of the branch breaker 20 to give $I_1=I_2$, which causes the branch breaker 20 not to be interrupted. Accordingly, the wiring 81 as the path for the artificial leakage current has to be electrically connected to the bus of the phase that is not electrically connected to the cathode of the branch breaker 20.

Figure 6:
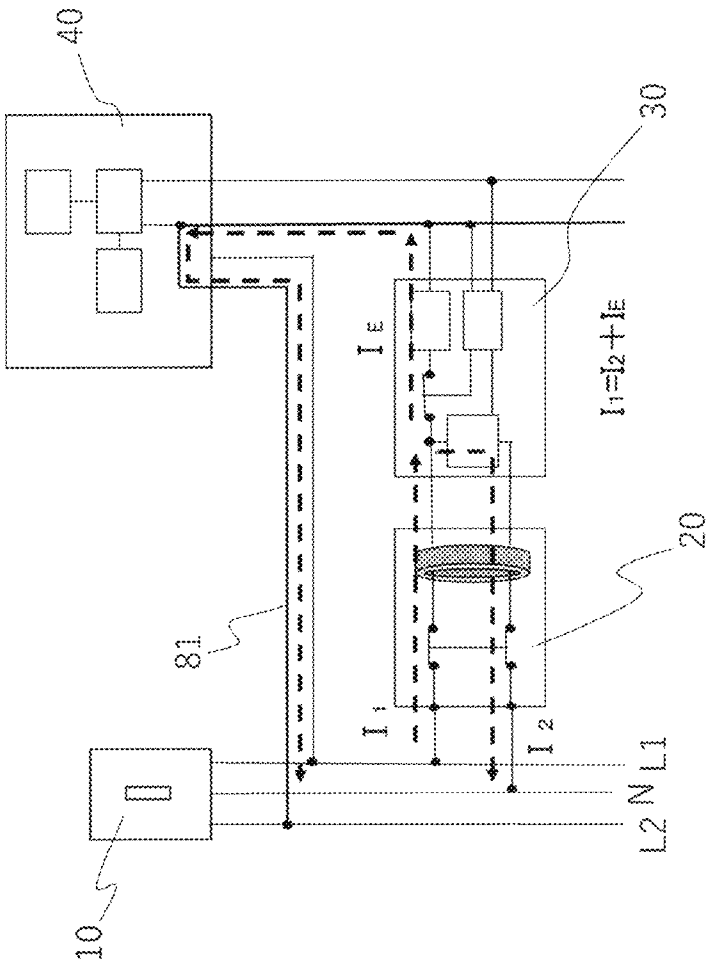
FIG. 6 is a schematic diagram illustrating a main breaker, one of branch breakers, one of discharge detection units, a control unit, and electric lines configuring a discharge detection system according to a second embodiment.

FIG. 6 illustrates a main breaker 10, one of branch breakers 20, one of discharge detection units 30, a control unit 40, and electric lines configuring the discharge detection system according to the second embodiment of the present invention. For example, if the cathodes of all the branch breakers 20 configuring the discharge detection system are electrically connected to the bus of the L1 phase, a wiring 81 as the path for an artificial leakage current may be electrically connected to the bus of the L2 phase. In other words, the path for the current $I_E$ is not particularly limited on condition that the current $I_E$ as the artificial leakage current is not returned to the cathode of the branch breaker 20.

3. Third Embodiment

Figure 7:
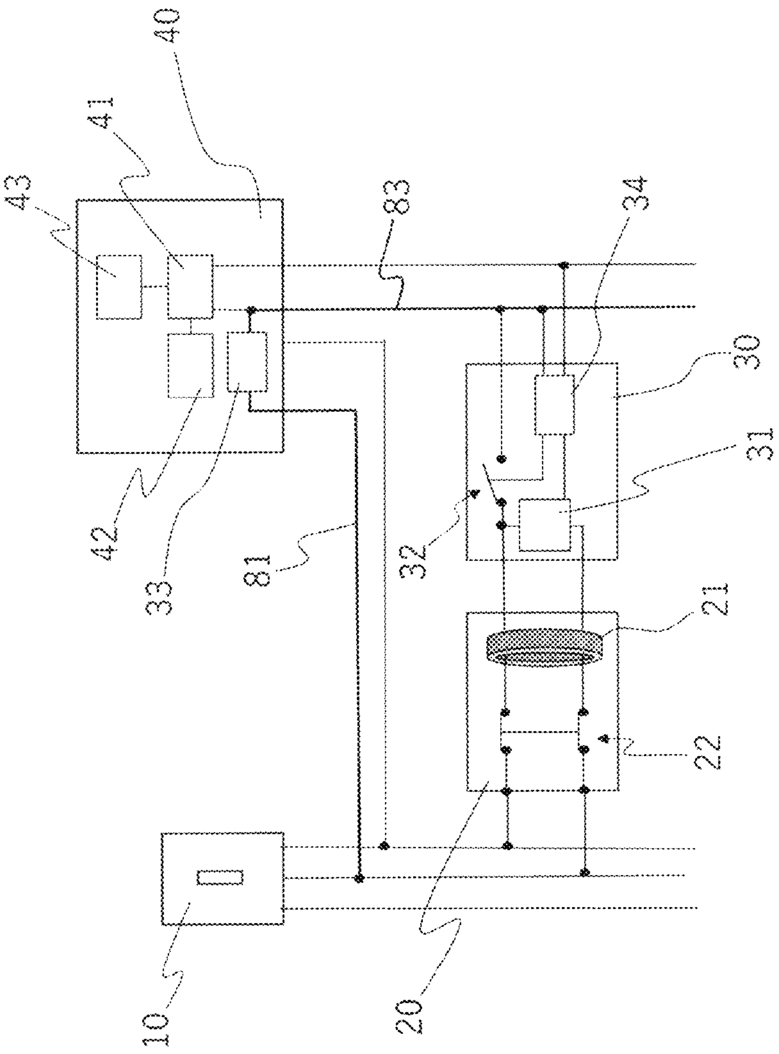
FIG. 7 is a schematic diagram illustrating a main breaker, one of branch breakers, one of discharge detection units, a control unit, and electric lines configuring a discharge detection system according to a third embodiment.

FIG. 7 illustrates a main breaker 10, one of branch breakers 20, one of discharge detection units 30, a control unit 40, and electric lines configuring the discharge detection system according to the third embodiment of the present invention. The discharge detection system described above in the first embodiment is configured to include each of the eight discharge detection units 30 provided with the current limiting resistor 33 (refer to FIG. 4). However, as illustrated in FIG. 7, the control unit 40 may be configured to include one current limiting resistor 33. The current limiting resistor 33 in FIG. 7 is electrically connected between the wiring 83 of the voltage phase and the wiring 81 of the ground phase. The one current limiting resistor 33 is used to generate an artificial leakage current in each of the eight discharge detection units 30.

For example, the resistance value of the current limiting resistor 33 in FIG. 7 is a value to generate an artificial leakage current of a current value capable of interrupting one of the branch breakers 20. In this case, only the one branch breaker 20 electrically connected to the discharge detection unit 30 in which the switch 32 is in the closed state is interrupted. As another example, the resistance value of the current limiting resistor 33 in FIG. 7 may be a value to generate an artificial leakage current of a current value capable of interrupting all the eight branch breakers 20. In this case, when the switches 32 of the plurality of discharge detection units 30 almost simultaneously turn into the closed state, the plurality of branch breakers 20 electrically connected to these discharge detection units 30 are almost simultaneously interrupted.

It should be noted that, even if the resistance value of the current limiting resistor 33 in FIG. 7 is a value in accordance with the sensitivity current of one of the branch breakers 20, it is possible to sequentially interrupt the plurality of branch breakers 20 by the control process of described later in the fourth embodiment. That is, if the discharge detection units 30 almost simultaneously detect discharge, the arithmetic section 41 of the control unit 40 varies the timing of sending the signal to the discharge detection units 30. Thus, the switches 32 of the discharge detection units 30 turn into the closed state at different timings. As a result, the one current limiting resistor 33 is capable of generating an artificial leakage current in each of the discharge detection units 30.

4. Fourth Embodiment

The discharge detection system according to the fourth embodiment of the present invention is then described with reference to FIGS. 9A through 9D. The discharge detection system in the present embodiment is characterized in the control process of a plurality of discharge detection units 30 executed by an arithmetic section 41 of a control unit 40. FIGS. 9A through 9D exemplify the control process of two discharge detection units 30 executed by the arithmetic section 41 of the control unit 40.

The plurality of discharge detection units 30 almost simultaneously detect discharge in some cases. In such a case, the arithmetic section 41 of the control unit 40 varies the timing of sending a second signal to the plurality of discharge detection units 30. Thus, the switches 32 of the discharge detection units 30 turn into the closed state at different timings. As a result, the branch breakers 20 electrically connected to each of the discharge detection units 30 are sequentially interrupted.

Figures 9A, 9B, 9C, 9D:
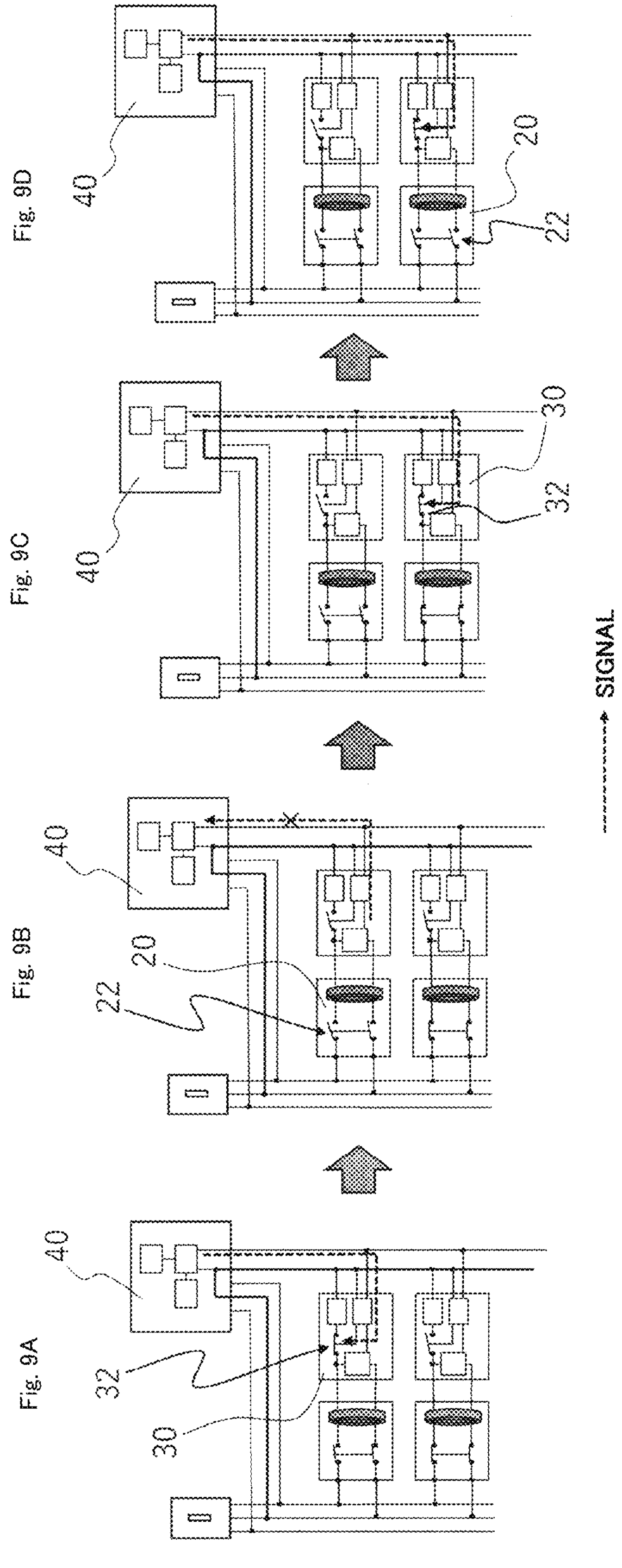
FIGS. 9A through 9D are schematic diagrams illustrating a control process flow of a discharge detection system according to a fourth embodiment.

If the two discharge detection units 30 illustrated in FIG. 9A almost simultaneously detect discharge, the arithmetic section 41 of the control unit 40 determines whether discharge has occurred based on the first signal received from each of the two discharge detection units 30. In this description, it is given that the arithmetic section 41 determines that discharge has occurred regarding each of the two first signals.

As illustrated by the arrow of the broken line in FIG. 9A, the arithmetic section 41 (internal communication section 41*a*) of the control unit 40 sends a second signal to the first discharge detection unit 30. The second signal is a command to operate the internal communication section 34 of the first discharge detection unit 30. The internal communication section 34 having received the second signal changes the switch 32 of the first discharge detection unit 30 from the open state to the closed state and generates an artificial leakage current. This artificial leakage current causes interruption of a first branch breaker 20 electrically connected to the first discharge detection unit 30 (refer to the two switches 22 in FIG. 9B). As a result, the power supply to the secondary side of the first branch breaker 20 is cut off.

Then, as illustrated by the arrow of the broken line in FIG. 9B, the arithmetic section 41 of the control unit 40 sends a third signal to the first discharge detection unit 30. The third signal is a command to request response to the internal communication section 34 of the first discharge detection unit 30. Since the first branch breaker 20 is interrupted, the power supply to the first discharge detection unit 30 is cut off. Accordingly, there is no response to the third signal by the first discharge detection unit 30. The arithmetic section 41 of the control unit 40 determines that the first branch breaker 20 is interrupted based on no response to the third signal. The arithmetic section 41 of the control unit 40 goes on to the control process of the second discharge detection unit 30.

Then, as illustrated by the arrow of the broken line in FIG. 9C, the arithmetic section 41 of the control unit 40 sends a second signal to the second discharge detection unit 30. The internal communication section 34 having received the second signal changes the switch 32 of the second discharge detection unit 30 from the open state to the closed state and generates an artificial leakage current. This artificial leakage current causes interruption of a second branch breaker 20 electrically connected to the second discharge detection unit 30 (refer to the two switches 22 in FIG. 9D). As a result, the power supply to the secondary side of the second branch breaker 20 is cut off.

Then, as illustrated by the arrow of the broken line in FIG. 9D, the arithmetic section 41 of the control unit 40 sends a third signal to the second discharge detection unit 30. Since the second branch breaker 20 is interrupted, the power supply to the second discharge detection unit 30 is cut off. Accordingly, there is no response to the third signal by the second discharge detection unit 30. The arithmetic section 41 of the control unit 40 determines that the second branch breaker 20 is interrupted based on no response to the third signal. The control process in the present embodiment is thus finished.

If three or more discharge detection units 30 almost simultaneously detect discharge, the arithmetic section 41 of the control unit 40 repeatedly executes the control process same as above to the three or more discharge detection units 30. It is thus possible to sequentially interrupt the plurality of branch breakers 20 electrically connected to the respective three or more discharge detection units 30.

The control process in the present embodiment is capable of sequentially interrupting the plurality of branch breakers 20, even if discharge has occurred almost simultaneously in a plurality of indoor wirings and/or a plurality of loads wired in a building, and capable of securely preventing accidents due to the discharge.

5. Fifth Embodiment

Figure 10:
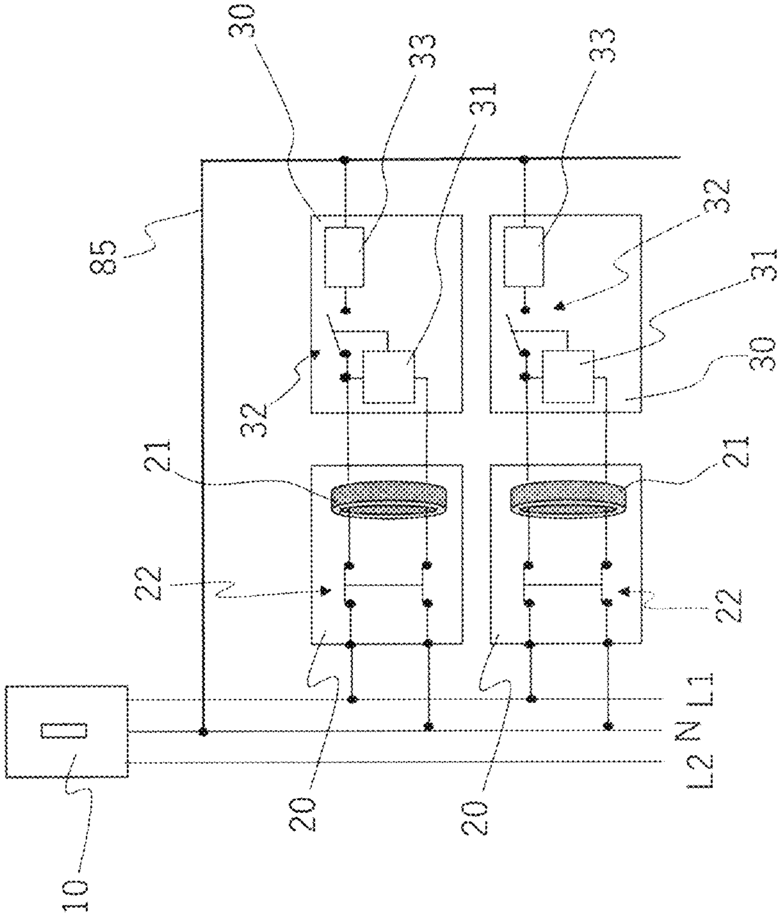
FIG. 10 is a schematic diagram illustrating a main breaker, two of branch breakers, two of discharge detection units, and electric lines configuring a discharge detection system according to a fifth embodiment.

FIG. 10 illustrates a main breaker 10, two of branch breakers 20, two of discharge detection units 30, and electric lines configuring the discharge detection system according to the fifth embodiment of the present invention. The discharge detection system in the present embodiment does not have the control unit 40 illustrated in FIG. 1. In addition, neither of the two branch breakers 20 configuring the discharge detection system in the present embodiment have the internal communication section 34. The current limiting resistor 33 of each of the two discharge detection units 30 is electrically connected to one wiring 85. The wiring 85 is electrically connected to the bus of the N phase. It should be noted that the kind of the wiring 85 is not particularly limited and may be any of an electric wire or a busbar.

If detecting discharge, the discharge detection section 31 of each discharge detection unit 30 changes the switches 22 from the open state to the closed state. Thus, the current $I_E$ as part of the current $I_1$ flowing from the bus of the L1 phase into the branch breaker 20 flows into the wiring 85 via the current limiting resistor 33. This current $I_E$ is the artificial leakage current and has the current value in accordance with the resistance value of the current limiting resistor 33. The current $I_E$ flows into the bus of the N phase electrically connected to the wiring 85. If the switch 32 turns into a closed state, the relationship between the currents $I_1$, $I_2$, and $I_E$ flowing in and out of the branch breaker 20 is $I_1=I_2+I_E$. In the case of $I_1 \neq I_2$, the ZCT 21 of the branch breaker 20 changes the two switches 22 from the closed state to the open state. The branch breaker 20 electrically connected to the primary side of the discharge detection unit 30 is thus interrupted. As a result, the power supply to the secondary side of the branch breaker 20 is stopped.

The discharge detection system in the present embodiment is capable of individually interrupting the plurality of branch breakers 20 by generating an artificial leakage current in the same manner as the first through third embodiments described above. The discharge detection system in the present embodiment can also be configured with the extremely simple circuit of the one wiring 85 illustrated in FIG. 10. Accordingly, this system does not require the effort of wiring to add the plurality of discharge detection units 30.

6. Others

The discharge detection system of the present invention is not limited to the embodiments described above. For example, the discharge detection system of the present invention is not limited to the wiring system of 3P2E illustrated in the drawings and is applicable to, for example, a system of 3P3E or 3P3E with no neutral elements. In addition, the two wirings 81 and 83 as the common path for an artificial leakage current may be replaced with one continuous electric wire or busbar.

DESCRIPTION OF REFERENCE NUMERALS

10 Main Breaker
20 Branch Breaker
21 ZCT
22 Switch
30 Discharge Detection Unit
31 Discharge Detection Section
32 Switch
33 Current Limiting Resistor
34 Internal Communication Section
40 Control Unit
41 Arithmetic Section
41*a* Internal Communication Section
42 External Communication Section
43 Display Section
81,83,85 Wiring

The invention claimed is:

1. A discharge detection system comprising: a main breaker; a plurality of branch breakers; a plurality of discharge detection units; and at least one current limiting resistor, wherein the main breaker has a plurality of electrodes for outputting power;

each of the branch breakers has first and second electrodes electrically connected to at least two of the plurality of electrodes of the main breaker and is configured to interrupt a circuit based on a difference in a current value between a current $I_1$ flowing in the first electrode and a current $I_2$ flowing in the second electrode, each of the plurality of discharge detection units is provided with a discharge detection section and a switch, the discharge detection section being electrically connected between the first electrode and the second electrode of the corresponding branch breaker and being configured to detect a noise present at a predetermined frequency or present at a plurality of predetermined frequencies superimposed on a voltage or current of the circuit, and the switch being electrically connected to the first electrode of the corresponding branch breaker, the switch of each discharge detection unit has a secondary side electrically connected to a common first electric line, the first electric line is electrically connected to an electrode different from the electrode electrically connected to the first electrode of the branch breaker out of the electrodes of the main breaker, and the current limiting resistor passes a current $I_E$ as part of the current $I_1$ through the first electric line when the switch is in a closed state.

2. The discharge detection system according to claim 1, further comprising a control unit capable of sending and receiving a signal to and from each of the plurality of discharge detection units, wherein each discharge detection unit is electrically connected to the control unit via a common second electric line, each of the discharge detection units is configured to send a first signal if the noise is detected by its corresponding discharge detection section, the control unit determines whether discharge has occurred in the circuit based on the first signal, and if determining that discharge has occurred, sends a second signal, and the discharge detection unit having sent the first signal causes the switch to be in a closed state based on the second signal.

3. The discharge detection system according to claim 2, comprising the one current limiting resistor corresponding to the respective discharge detection units, wherein the current limiting resistor is built in the control unit, and the control unit is electrically connected to middle of the first electric line.

4. The discharge detection system according to claim 2, wherein the control unit varies a timing of sending the second signal to each of the plurality of discharge detection units if determining that discharge has occurred in two or more of the circuits based on the first signals received from the respective discharge detection units.

5. The discharge detection system according to claim 4, wherein the control unit sends the second signal to any one of the plurality of discharge detection units and then sends a third signal to the same discharge detection unit, and based on no response to the third signal, sends the second signal to another of the discharge detection units.

6. The discharge detection system according to claim 1, comprising a plurality of the current limiting resistors corresponding to the respective discharge detection units, wherein each of the current limiting resistors is built in the corresponding discharge detection unit and is electrically connected to the secondary side of the switch, and the first electric line is electrically connected to the secondary side of the current limiting resistor.

* * * * *